United States Patent
Riley et al.

(10) Patent No.: US 9,659,825 B2
(45) Date of Patent: *May 23, 2017

(54) METHOD OF CMOS MANUFACTURING UTILIZING MULTI-LAYER EPITAXIAL HARDMASK FILMS FOR IMPROVED EPI PROFILE

(71) Applicant: Texas Instruments Incorporated, Dallas, TX (US)

(72) Inventors: Deborah Jean Riley, Murphy, TX (US); Seung-Chul Song, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/746,106

(22) Filed: Jun. 22, 2015

(65) Prior Publication Data

US 2015/0287647 A1 Oct. 8, 2015

Related U.S. Application Data

(63) Continuation of application No. 13/950,842, filed on Jul. 25, 2013, now Pat. No. 9,093,555.

(51) Int. Cl.
*H01L 21/8238* (2006.01)

(52) U.S. Cl.
CPC ........... *H01L 21/823814* (2013.01); *H01L 21/82385* (2013.01); *H01L 21/823807* (2013.01); *H01L 21/823864* (2013.01)

(58) Field of Classification Search
CPC ..... H01L 21/823807; H01L 21/823814; H01L 21/82385; H01L 21/823864
USPC .......................... 438/199, 229, 458; 257/190
See application file for complete search history.

(56) References Cited

U.S. PATENT DOCUMENTS

| | | | |
|---|---|---|---|
| 8,455,930 B2* | 6/2013 | Cheng | H01L 21/823412 257/255 |
| 8,835,995 B2* | 9/2014 | Kang | H01L 21/0245 257/288 |
| 9,136,176 B2* | 9/2015 | Kim | H01L 21/0243 |
| 9,269,811 B2* | 2/2016 | Chou | H01L 29/6653 |
| 9,362,407 B1* | 6/2016 | Basker | H01L 29/7856 |
| 2007/0048920 A1* | 3/2007 | Song | H01L 21/823842 438/199 |
| 2009/0001420 A1* | 1/2009 | Matsumoto | H01L 21/823807 257/190 |
| 2009/0239354 A1 | 9/2009 | Suzawa et al. | |
| 2009/0263972 A1* | 10/2009 | Balseanu | H01L 21/3086 438/696 |
| 2011/0201164 A1* | 8/2011 | Chung | H01L 21/823807 438/229 |

(Continued)

*Primary Examiner* — Mohammed Shamsuzzaman
(74) *Attorney, Agent, or Firm* — Jacqueline J. Garner; Charles A. Brill; Frank D. Cimino

(57) ABSTRACT

An integrated circuit containing PMOS transistors may be formed by forming a dual layer hard mask. A first layer of the hard mask is halogen-containing silicon nitride formed using a halogenated silane reagent. A second layer of the hard mask is silicon nitride formed on the first layer using halogen-free reagents. After source/drain cavities are etched in the PMOS transistors, a pre-epitaxial bake with hydrogen is performed. After SiGe epitaxial source/drain regions are formed, the hard mask is removed.

20 Claims, 8 Drawing Sheets

(56) References Cited

U.S. PATENT DOCUMENTS

2015/0031177 A1\* 1/2015 Riley .............. H01L 21/823807
　　　　　　　　　　　　　　　　　　　438/199
2015/0031178 A1\* 1/2015 Riley .............. H01L 21/823807
　　　　　　　　　　　　　　　　　　　438/199

\* cited by examiner

US 9,659,825 B2

METHOD OF CMOS MANUFACTURING UTILIZING MULTI-LAYER EPITAXIAL HARDMASK FILMS FOR IMPROVED EPI PROFILE

CROSS REFERENCE TO RELATED APPLICATIONS

This application is a continuation of U.S. Nonprovisional patent application Ser. No. 13/950,842, filed Jul. 25, 2013, the contents of which are herein incorporated by reference in its entirety.

FIELD OF THE INVENTION

This invention relates to the field of integrated circuits. More particularly, this invention relates to metal oxide semiconductor (MOS) transistors in integrated circuits.

BACKGROUND OF THE INVENTION

An integrated circuit containing p-channel metal oxide semiconductor (PMOS) transistors and n-channel metal oxide semiconductor (NMOS) transistors may be formed with silicon-germanium (SiGe) epitaxial source/drain regions in the PMOS transistors. An hard mask containing silicon nitride may be used to block the SiGe epitaxial material from the NMOS transistors. It may be desirable to form a uniform thin hard mask to maintain lateral separation between the SiGe epitaxial source/drain and the gate below a maximum allowable distance and with a desired uniformity. It may further be desirable to maintain rounding of the PMOS source/drain cavity below a maximum allowable radius. Forming the hard mask so as to simultaneously satisfy these criteria has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing PMOS transistors may be formed by forming a dual layer hard mask. A first layer of the hard mask is halogen-containing silicon nitride formed using a halogenated silane reagent. A second layer of the hard mask is silicon nitride formed on the first layer using halogen-free reagents. After source/drain cavities are etched in the PMOS transistors, a pre-epitaxial bake with hydrogen is performed. After SiGe epitaxial source/drain regions are formed, the hard mask is removed.

DETAILED DESCRIPTION OF EXAMPLE EMBODIMENTS

The following co-pending patent application is related and hereby incorporated by reference: U.S. patent application Ser. No. 13/950,909, filed Jul. 25, 2013 (now U.S. Pat. No. 9,224,656).

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing PMOS transistors and NMOS transistors may be formed by forming a dual layer hard mask. A first layer of the hard mask is halogen-containing silicon nitride formed using a halogenated silane reagent. A second layer of the hard mask is silicon nitride formed on the first layer using halogen-free reagents. After source/drain cavities are etched in the PMOS transistors, a pre-epitaxial bake with hydrogen is performed. After SiGe epitaxial source/drain regions are formed, the hard mask is removed. The dual layer hard mask may be used to form SiGe epitaxial source/drain regions in low-voltage PMOS transistors in logic circuits and/or high-voltage PMOS transistors in input/output (I/O) circuits. Forming the second layer of the hard mask without a halogenated silane reagent may reduce escape of halogen from the dual layer hard mask during a pre-epitaxial hydrogen prebake so that radii of corners of source/drain cavities will not increase beyond a desired value, which may in turn provide desired values for parameters of the PMOS transistors, such as on-state current.

For the purposes of this disclosure, the terms halogen and halogenated will be understood to refer to fluorine, chlorine, and bromine.

Figure 1A:
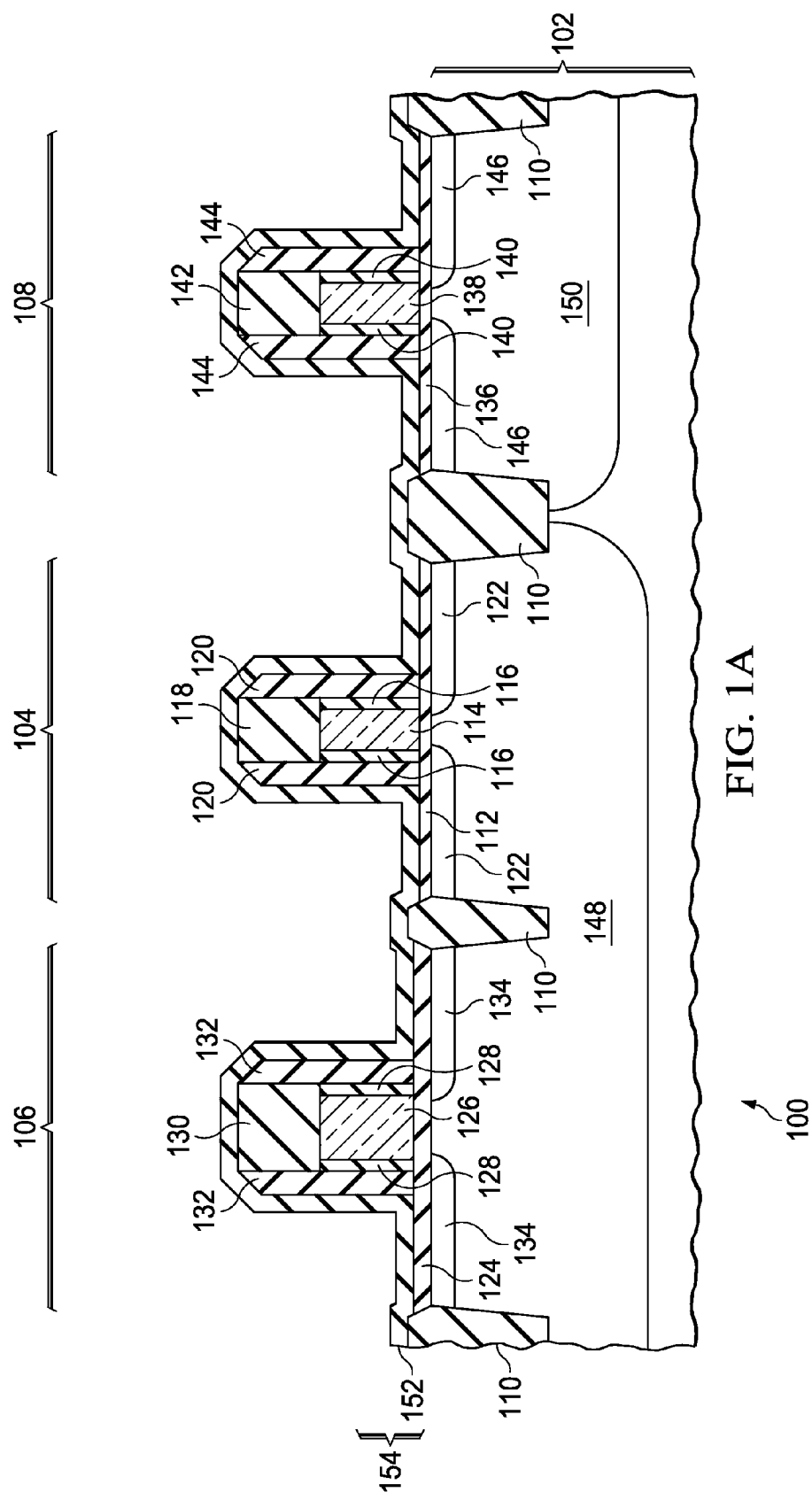
FIG. 1A through FIG. 1H are cross sections of an integrated circuit formed using an exemplary dual layer hard mask, depicted in successive stages of fabrication.

FIG. 1A through FIG. 1H are cross sections of an integrated circuit formed using an exemplary dual layer hard mask, depicted in successive stages of fabrication. Referring to FIG. 1A, the integrated circuit 100 is formed in and on a substrate 102 such as a single crystal silicon wafer, a silicon-on-insulator (SOI) wafer, a hybrid orientation technology (HOT) wafer with regions of different crystal orientations, or other substrate appropriate for fabrication of the integrated circuit 100. The integrated circuit 100 includes an area for a low-voltage PMOS transistor 104, a high-voltage PMOS transistor 106 and a low-voltage NMOS transistor 108. The low-voltage PMOS transistor 104 and the low-voltage NMOS transistor 108 may be in, for example, a logic circuit or a static random access memory (SRAM) cell. The high-voltage PMOS transistor 106 may be in, for example, an I/O circuit. The low-voltage PMOS transistor 104, the high-voltage PMOS transistor 106 and the low-voltage NMOS transistor 108 are laterally separated by field oxide 110 formed at a top surface of the substrate 102, for example using a shallow trench isolation (STI) process.

The low-voltage PMOS transistor 104 includes a gate dielectric layer 112 formed on the top surface of the substrate 102, a gate 114 formed on the gate dielectric layer 112, a gate hard mask 118 on the gate 114, gate oxidation 116 formed on lateral surfaces of the gate 114, and gate offset spacers 120 formed on lateral surfaces of the gate oxidation 116 and the gate hard mask 118. P-channel lightly doped drain (PLDD) regions 122 are formed in the substrate 102 adjacent to the gate 114 by implanting p-type dopants such as boron and co-implant species such as carbon and fluorine, followed by annealing the substrate 102.

The high-voltage PMOS transistor 106 includes a gate dielectric layer 124, which is at least 30 percent thicker than the gate dielectric layer 112 of the low-voltage PMOS transistor 104, formed on the top surface of the substrate 102. The high-voltage PMOS transistor 106 includes a gate 126, which has a gate length which is at least 30 percent longer than a gate length of the gate 114 of the low-voltage PMOS transistor 104, formed on the gate dielectric layer 124. The high-voltage PMOS transistor 106 includes a gate hard mask 130 on the gate 126, gate oxidation 128 formed on lateral surfaces of the gate 126, and gate offset spacers 132 formed on lateral surfaces of the gate oxidation 128 and the gate hard mask 130. PLDD regions 134 are formed in the substrate 102 adjacent to the gate 126 by implanting p-type dopants and co-implant species, followed by annealing the substrate 102.

The low-voltage NMOS transistor 108 includes a gate dielectric layer 136 formed on the top surface of the substrate 102. The low-voltage NMOS transistor 108 includes a gate 138 formed on the gate dielectric layer 136. The low-voltage NMOS transistor 108 includes a gate hard mask 142 on the gate 138. The low-voltage NMOS transistor 108 includes gate oxidation 140 formed on lateral surfaces of the gate 138, and gate offset spacers 144 formed on lateral surfaces of the gate oxidation 140 and the gate hard mask 142. N-channel lightly doped drain (NLDD) regions 146 are formed in the substrate 102 adjacent to the gate 138 by implanting n-type dopants such as phosphorus and co-implant species such as carbon, followed by annealing the substrate 102.

The gate dielectric layer 112 of the low-voltage PMOS transistor 104 and the gate dielectric layer 136 of the low-voltage NMOS transistor 108 may be formed concurrently. The gate 114 of the low-voltage PMOS transistor 104, the gate 126 of the high-voltage PMOS transistor 106, and the gate 138 of the low-voltage NMOS transistor 108 may be formed concurrently. The gate oxidation 116 of the low-voltage PMOS transistor 104, the gate oxidation 128 of the high-voltage PMOS transistor 106, and the gate oxidation 140 of the low-voltage NMOS transistor 108 may be formed concurrently. The gate offset spacers 120 of the low-voltage PMOS transistor 104, the gate offset spacers 132 of the high-voltage PMOS transistor 106, and the gate offset spacers 144 of the low-voltage NMOS transistor 108 may be formed concurrently. The PLDD regions 122 of the low-voltage PMOS transistor 104 and the PLDD regions 134 of the high-voltage PMOS transistor 106 may be formed concurrently.

The low-voltage PMOS transistor 104 and the high-voltage PMOS transistor 106 are formed in n-type wells 148, possibly the same n-type well 148 as depicted in FIG. 1A, which was formed in the substrate 102 possibly after the field oxide 110. The low-voltage NMOS transistor 108 is formed in a p-type well 150 which was formed in the substrate 102 possibly after the field oxide 110.

A first layer 152 of the dual layer hard mask 154 is formed over an existing top surface of the integrated circuit 100, contacting the gate offset spacers 120 of the low-voltage PMOS transistor 104, the gate offset spacers 132 of the high-voltage PMOS transistor 106 and the gate offset spacers 144 of the low-voltage NMOS transistor 108. The first layer 152 is halogen-containing silicon nitride formed by a plasma enhanced chemical vapor deposition (PECVD) process with a halogenated silane reagent, such as hexachlorodisilane, and ammonia. The PECVD process for forming the first layer 152 may be performed at, for example, 550° C. to 600° C. The first layer 152 may be, for example, 10 nanometers to 30 nanometers thick. Forming the first layer 152 with the halogenated silane reagent may advantageously provide a desired level of conformality in the first layer 152, so that the thickness of the first layer 152 on vertical surfaces, such as the lateral surfaces of the gate offset spacers 120 of the low-voltage PMOS transistor 104, is at least 80 percent of the thickness of the first layer 152 on horizontal surfaces of the integrated circuit 100. Furthermore, forming the first layer 152 with the halogenated silane reagent may advantageously provide a desired level of thickness uniformity across regions of the integrated circuit 100 with different densities of gates. For example, forming the first layer 152 with the halogenated silane reagent may produce thicknesses of the first layer 152 on vertical surfaces in dense regions such as an SRAM and in sparse regions such as isolated logic gates which are within 5 percent of each other, providing a desired uniformity of lateral separations between gates and SiGe epitaxial source/drain regions.

Figure 1B:
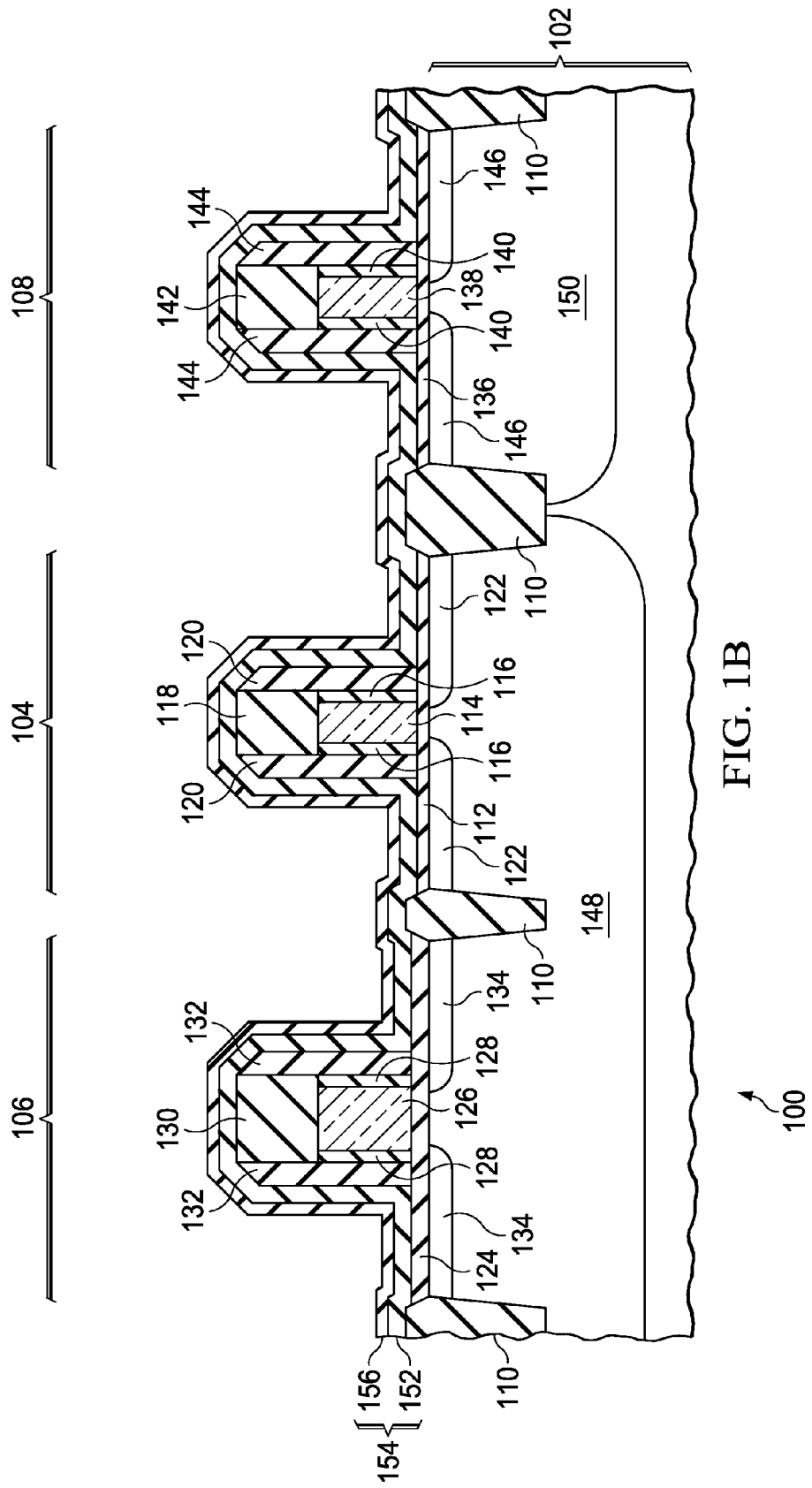

Referring to FIG. 1B, a second layer 156 of the dual layer hard mask 154 is formed on the first layer 152. The second layer 156 is silicon nitride formed by a PECVD process with a silane reagent, such as disilane, and ammonia, without any halogenated reagents. The PECVD process for forming the second layer 156 may be performed at, for example, 675° C. to 725° C. The second layer 156 may be, for example, 2 nanometers to 10 nanometers thick. Forming the second layer 156 without halogenated reagents provides a lower halogen concentration on the second layer 156 compared to the first layer 152.

Figure 1C:
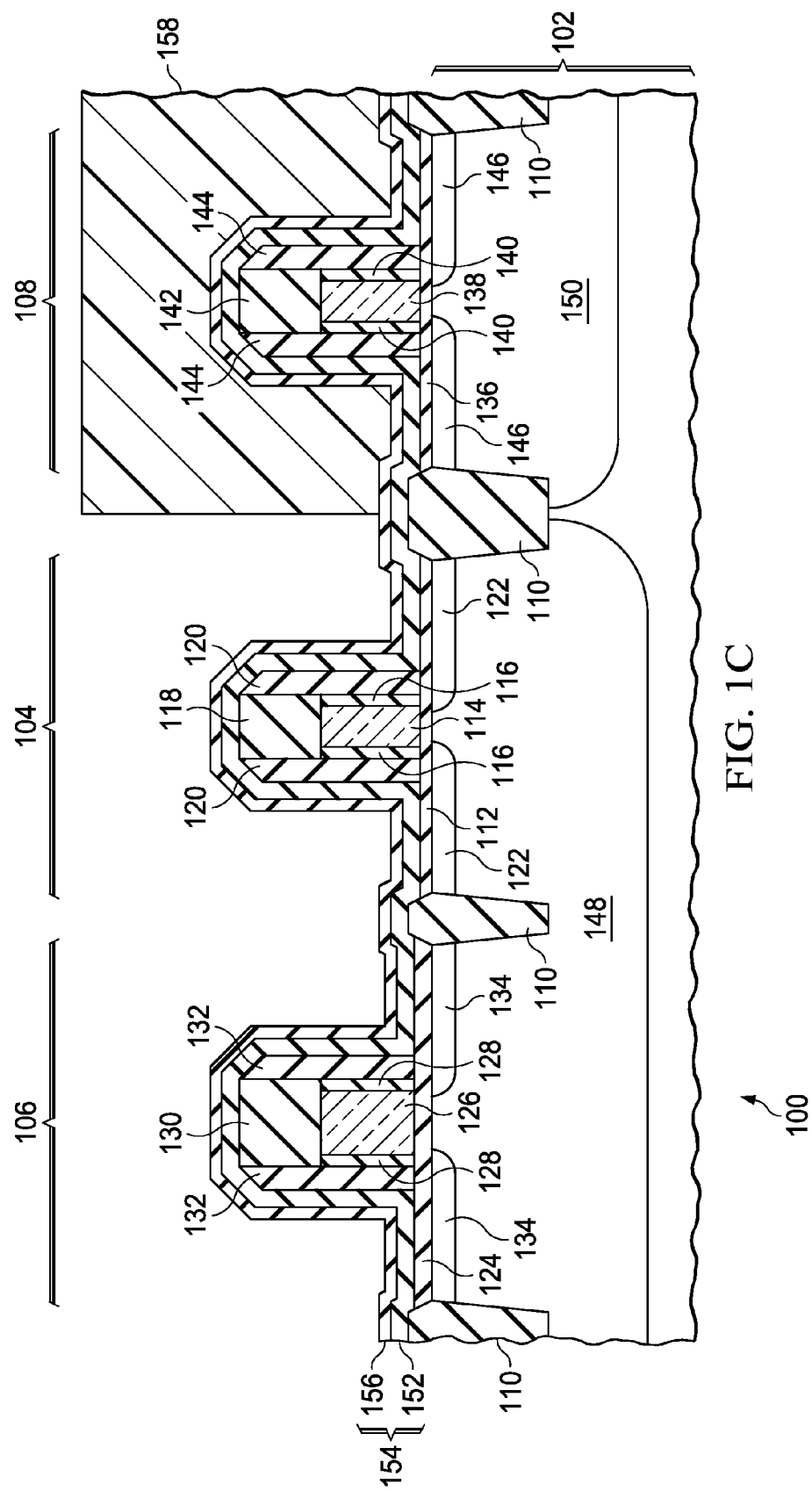

Referring to FIG. 1C, an etch mask 158 is formed over the integrated circuit 100 so as to expose areas for subsequent SiGe epitaxial layers, such as the low-voltage PMOS transistor 104 and possibly the high-voltage PMOS transistor 106, and to cover areas such as the low-voltage NMOS transistor 108 to be excluded from the SiGe epitaxial layers. The etch mask 158 may include photoresist formed by a photolithographic process.

Figure 1D:
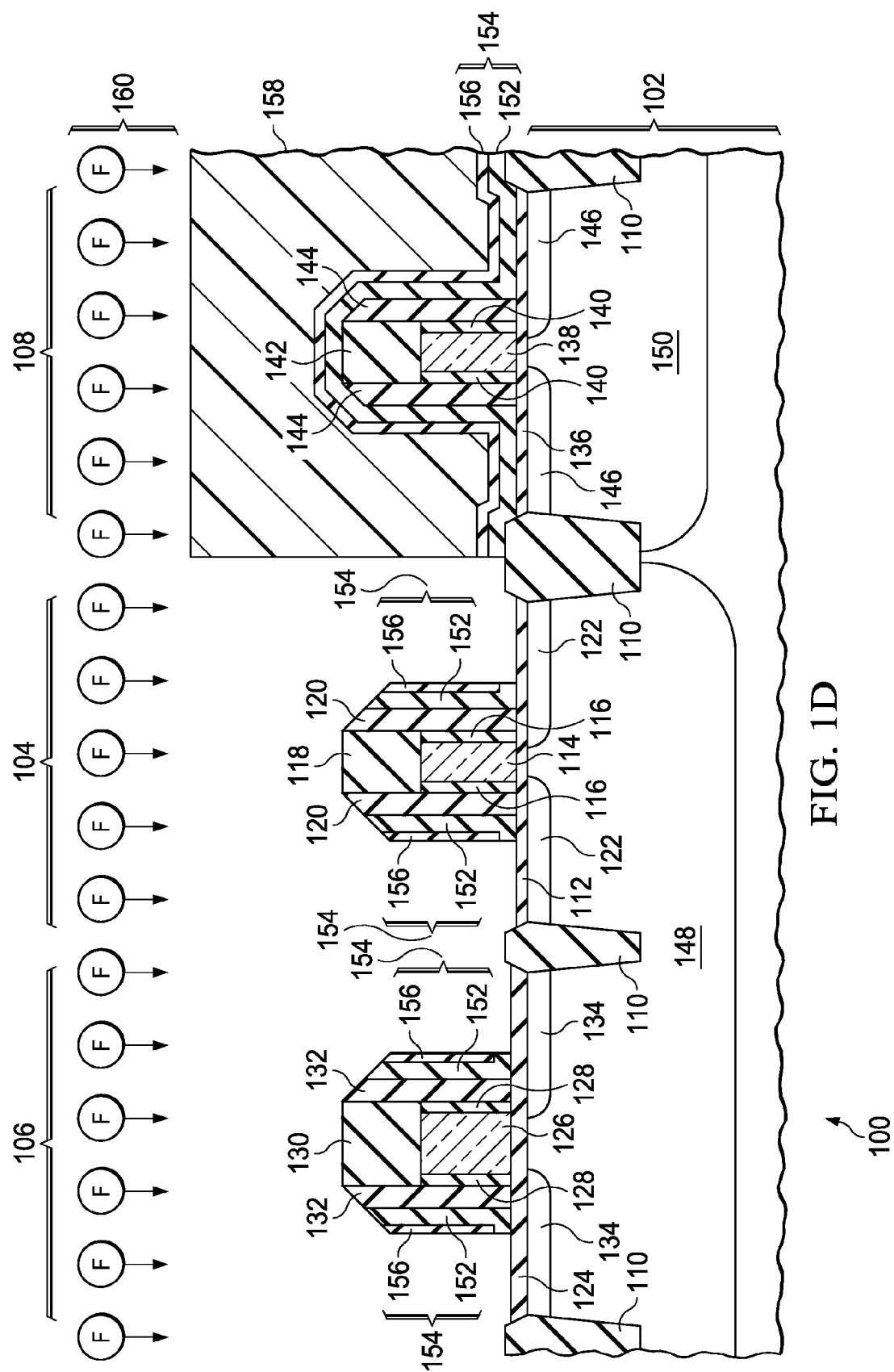

Referring to FIG. 1D, an anisotropic etch process 160 removes the second layer 156 and the first layer 152 from horizontal surfaces of the integrated circuit 100 which are exposed by the etch mask 158. The dual layer hard mask 154 remains on the lateral surfaces of the gate offset spacers 120 of the low-voltage PMOS transistor 104 and the gate offset spacers 132 of the high-voltage PMOS transistor 106. The anisotropic etch process 160 may include, for example, a reactive ion etch (RIE) process using fluorine radicals. The etch mask 158 is removed after the anisotropic etch process 160 is completed.

Figure 1E:
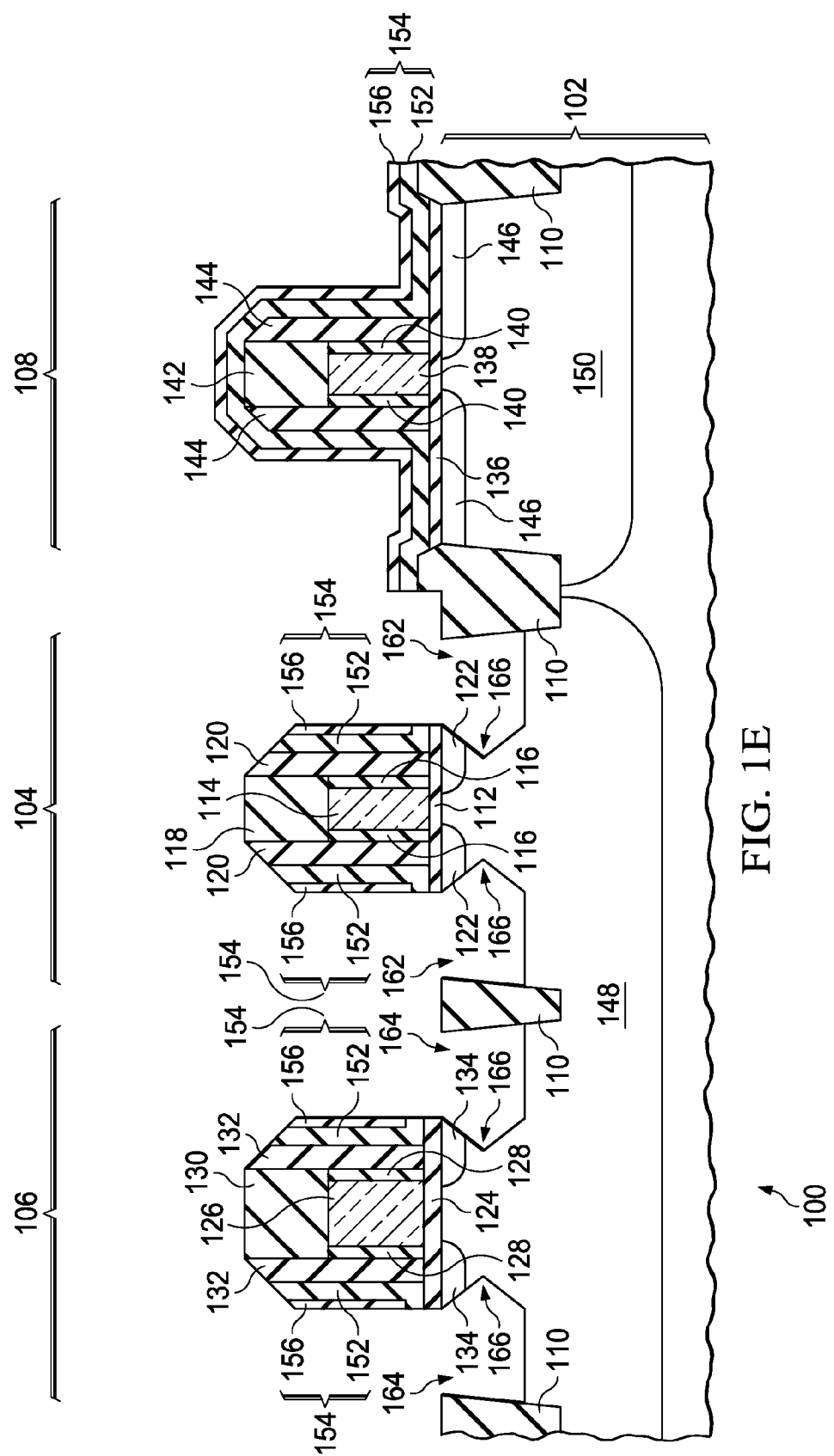

Referring to FIG. 1E, a source/drain etch process removes material from the substrate 102 in source/drain regions of the low-voltage PMOS transistor 104 to form source/drain cavities 162, and in source/drain regions of the high-voltage PMOS transistor 106 if exposed by the etch mask 158 to form source/drain cavities 164. The source/drain etch process may include an RIE step to remove semiconductor material from the substrate 102 followed by a wet crystallographic etch using tetramethyl ammonium hydroxide (TMAH) or ammonium hydroxide to remove further semiconductor material from the substrate 102 along <111> crystallographic planes. The source/drain etch process is performed so that the source/drain cavities 162 and 164 have corners 166 under the PLDD regions 122 and 134, respectively, with internal radii less than 2 nanometers.

Figure 1F:
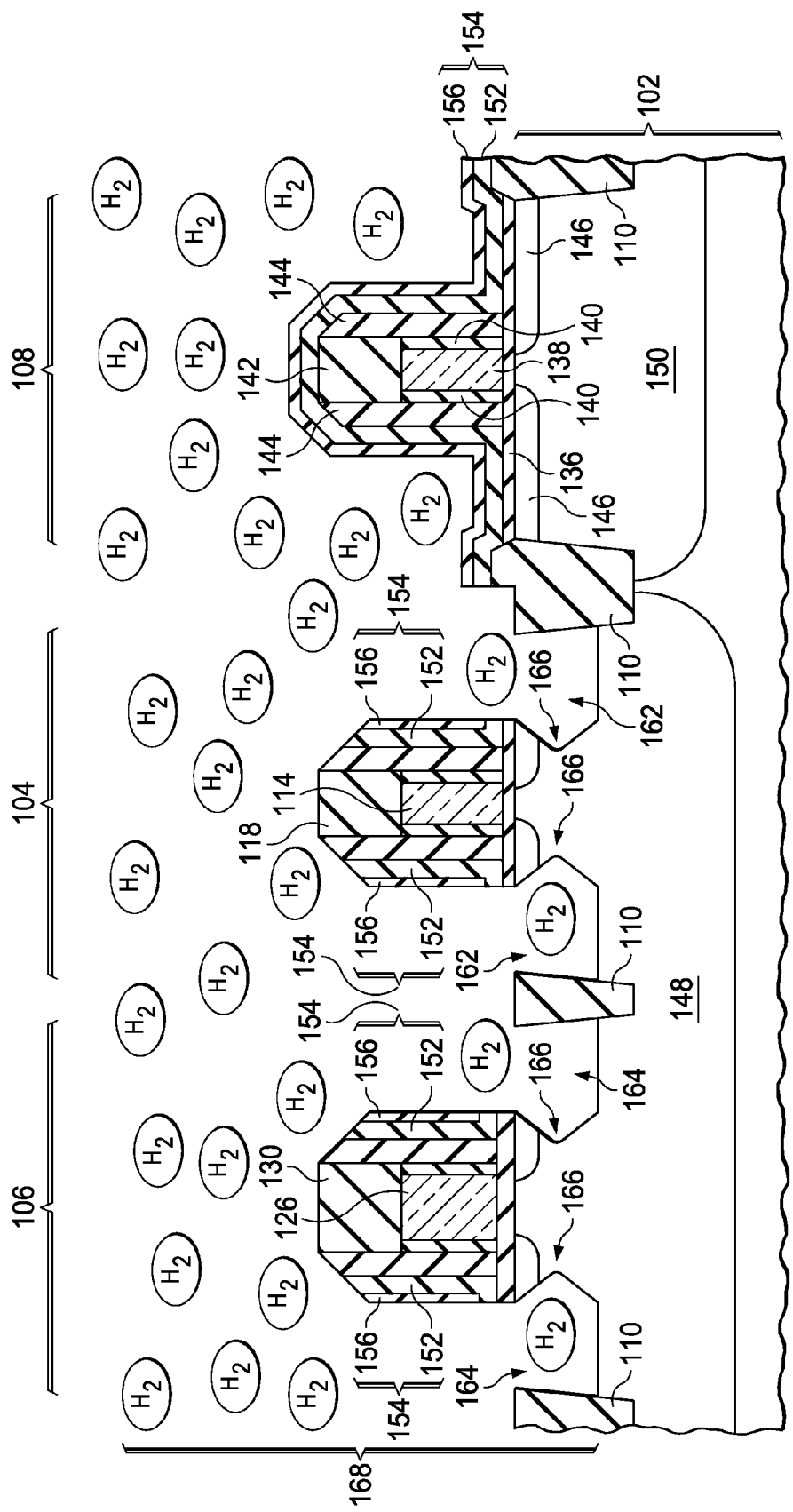

Referring to FIG. 1F, a pre-epitaxial hydrogen prebake is performed in which the integrated circuit 100 is exposed to a hydrogen-containing ambient 168 while the substrate 102 is heated to 750° C. to 850° C. for 30 seconds to 200 seconds. The hydrogen-containing ambient 168 may include, for example, 0.5 percent to 2 percent hydrogen at a pressure of 5 to 20 torr.

During the pre-epitaxial hydrogen prebake, the corners 166 of the source/drain cavities 162 and 164 may round as depicted in FIG. 1F due to silicon atom migration. Forming the second layer 156 of the dual layer hard mask 154 without halogenated reagents may advantageously reduce escape of halogen from the dual layer hard mask 154 during the pre-epitaxial hydrogen prebake so that the radii of the corners 166 increase to no more than 5 nanometers, which may provide desired values for parameters of the low-voltage PMOS transistor 104 and the high-voltage PMOS transistor 106, such as on-state current.

Figure 1G:
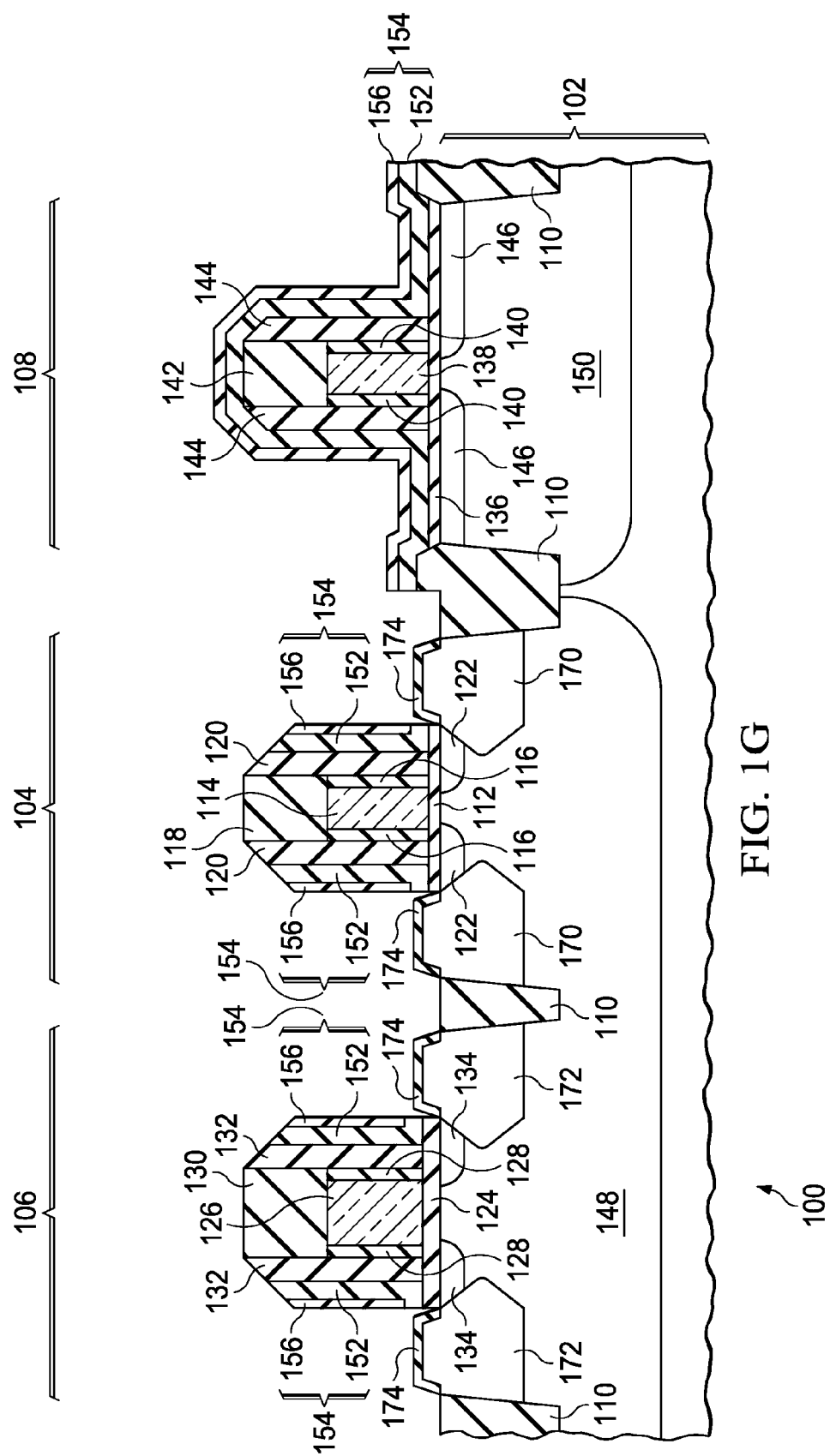

Referring to FIG. 1G, a silicon-germanium epitaxial process forms SiGe source/drain regions 170 in the source/drain cavities 162 of the low-voltage PMOS transistor 104, and concurrently forms SiGe source/drain regions 172 in the source/drain cavities 164, if present, of the high-voltage PMOS transistor 106. The SiGe source/drain regions 170 and 172 may have a germanium atomic fraction of 20 percent to 50 percent. The silicon-germanium epitaxial process may form silicon caps 174 on the SiGe source/drain regions 170 and 172.

Figure 1H:
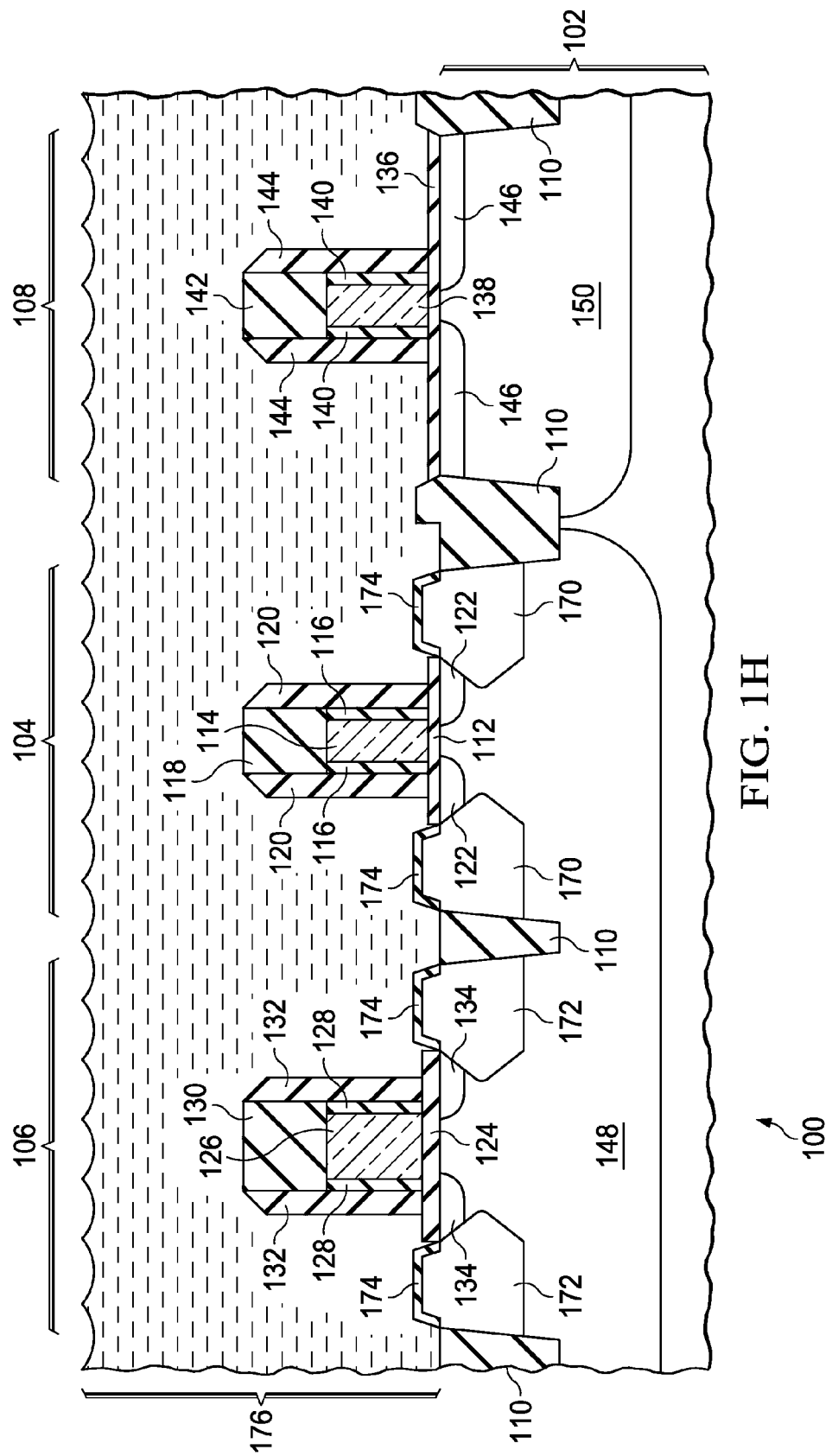

Referring to FIG. 1H, the integrated circuit 100 is exposed to a wet etch process 176 which removes the first layer 152 and the second layer 156 of the dual layer hard mask 154. The wet etch process 176 may include a phosphoric acid containing etch step at 150° C. to 160° C., for 60 seconds to 180 seconds. The phosphoric acid containing etch may be, for example, an aqueous seasoned phosphoric acid or an aqueous mixture of phosphoric acid and sulfuric acid. The wet etch process 176 is performed so that at least a portion of the gate offset spacers 120 of the low-voltage PMOS transistor 104, the gate offset spacers 132 of the high-voltage PMOS transistor 106, and the gate offset spacers 144 of the low-voltage NMOS transistor 108 remains after the wet etch process 176 is completed. Fabrication of the integrated circuit 100 is continued, for example by forming gate sidewall spacers adjacent to the gate 114 of the low-voltage PMOS transistor 104, the gate 126 of the high-voltage PMOS transistor 106, and the gate 138 of the low-voltage NMOS transistor 108.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
    forming a gate of a p-channel metal oxide semiconductor (PMOS) transistor over a substrate;
    forming a first layer of a dual layer hard mask over the gate of the PMOS transistor and the substrate, said first layer being halogen-containing silicon nitride formed by a plasma enhanced chemical vapor deposition (PECVD) process with a halogenated silane reagent and ammonia;
    forming a second layer of said dual layer hard mask on said first layer, said second layer being silicon nitride formed by a PECVD process free of a halogenated reagent;
    removing said second layer and said first layer from horizontal surfaces of said substrate and the gate of the PMOS transistor by an anisotropic etch, leaving said second layer and said first layer on lateral surfaces of gate offset spacers disposed on lateral surfaces of said gate of said PMOS transistor;
    subsequently removing material from the substrate to form source/drain cavities adjacent to said gate of said PMOS transistor;
    subsequently heating said the substrate in a hydrogen containing ambient; subsequently forming silicon-germanium (SiGe) source/drain regions in said source/drain cavities by an epitaxial process; and
    subsequently removing said second layer and said first layer from the lateral surfaces of gate offset spacers by a wet etch process.

2. The method of claim 1, in which said halogenated silane reagent is hexachlorodisilane.

3. The method of claim 1, in which said first layer is formed at 550° C. to 600° C.

4. The method of claim 1, in which said first layer is 10 nanometers to 30 nanometers thick.

5. The method of claim 1, in which a thickness of said first layer on vertical surfaces of said integrated circuit is at least 80 percent of a thickness of said first layer on horizontal surfaces of said integrated circuit.

6. The method of claim 1, in which a thickness of said first layer on vertical surfaces in a static random access memory (SRAM) of said integrated circuit and a thickness of said first layer on vertical surfaces in a logic circuit of said integrated circuit are within 5 percent of each other.

7. The method of claim 1, in which said second layer is formed with disilane and ammonia.

8. The method of claim 1, in which said second layer is formed at 675° C. to 725° C.

9. The method of claim 1, in which said second layer is 2 nanometers to 10 nanometers thick.

10. The method of claim 1, in which said step of heating said integrated circuit is performed at 750° C. to 850° C.

11. The method of claim 1, in which said step of heating said integrated circuit is performed for 30 seconds to 200 seconds.

12. The method of claim 1, in which said step of heating said integrated circuit is performed at a pressure of 5 to 20 torr.

13. The method of claim 1, in which said hydrogen-containing ambient includes 0.5 percent to 2 percent hydrogen.

14. The method of claim 1, in which radii of corners of said source/drain cavities under p-channel lightly doped drain (PLDD) regions of said PMOS transistor increase to no more than 5 nanometers during said step of heating said integrated circuit.

15. The method of claim 1, in which said wet etch process includes a phosphoric acid containing etch step.

16. The method of claim 15, in which said phosphoric acid containing etch step is performed at 150° C. to 160° C.

17. The method of claim 16, in which said phosphoric acid containing etch step is performed for 60 seconds to 180 seconds.

18. The method of claim 1, further comprising the step of forming an etch mask over said integrated circuit so as to expose said PMOS transistor and cover an n-channel metal oxide semiconductor (NMOS) transistor, performed after said step of forming said second layer and prior to said step of removing said second layer and said first layer from the horizontal surfaces of said substrate.

19. The method of claim 1, in which:
said PMOS transistor is a low-voltage PMOS transistor;
said integrated circuit includes a high-voltage PMOS transistor, in which a gate dielectric layer of said high-voltage PMOS transistor is at least 30 percent thicker than a gate dielectric layer of said low-voltage PMOS transistor;
said first layer is formed over a gate of said high-voltage PMOS transistor;
said step of removing said second layer and said first layer from horizontal surfaces of said integrated circuit leaves said second layer and said first layer on lateral surfaces of gate offset spacers disposed on lateral surfaces of said gate of said high-voltage PMOS transistor; and
said step of removing material from said substrate of said integrated circuit also forms source/drain cavities adjacent to said gate of said high-voltage PMOS transistor.

20. A method of forming an integrated circuit, comprising the steps of:
forming a gate for a PMOS transistor over a semiconductor substrate; forming a gate for an NMOS transistor over the semiconductor substrate; forming a first layer of a dual layer hard mask over the gate of the PMOS transistor and the gate of the NMOS transistor, said first layer being halogen-containing silicon nitride formed by a PECVD process with a halogenated silane reagent and ammonia;
forming a second layer of said dual layer hard mask on said first layer, said second layer being silicon nitride formed by a PECVD process free of a halogenated reagent;
forming an etch mask over said second layer of said dual layer hard mask so as to cover said NMOS transistor and expose said PMOS transistor;
removing portions of said second layer and said first layer in areas exposed by said etch mask by an anisotropic etch, leaving said second layer and said first layer on lateral surfaces of gate offset spacers disposed on lateral surfaces of said gate of said PMOS transistor, and leaving said second layer and said first layer over said NMOS transistor;
subsequently removing said etch mask;
subsequently removing material from the semiconductor substrate to form source/drain cavities adjacent to said gate of said PMOS transistor;
subsequently heating said integrated circuit in a hydrogen containing ambient;
subsequently forming SiGe source/drain regions in said source/drain cavities by an epitaxial process; and
subsequently removing said second layer and said first layer from lateral surfaces of gate offset spacers and over the NMOS transistor by a wet etch process.

* * * * *